United States Patent [19]

Jain et al.

[11] Patent Number: 4,863,827
[45] Date of Patent: Sep. 5, 1989

[54] POSTIVE WORKING MULTI-LEVEL PHOTORESIST

[75] Inventors: Sangya Jain, Bridgewater, N.J.; Yuh-Loo Chang, East Setauket, N.Y.

[73] Assignee: American Hoechst Corporation, Somerville, N.J.

[21] Appl. No.: 921,291

[22] Filed: Oct. 20, 1986

[51] Int. Cl.$^4$ .............................................. G03F 7/26
[52] U.S. Cl. .................................... 430/145; 430/148; 430/156; 430/191; 430/311; 430/312; 430/326; 430/327; 430/328; 430/329; 430/330

[58] Field of Search ................................ 430/312, 156

[56] References Cited

U.S. PATENT DOCUMENTS

| | | | |
|---|---|---|---|
| 2,702,243 | 2/1955 | Schmidt | 430/156 |
| 3,215,529 | 11/1965 | Lindquist et al. | 96/27 |
| 3,313,626 | 4/1967 | Whitney | 430/156 |
| 3,353,984 | 11/1967 | Landau et al. | 117/34 |
| 3,419,370 | 12/1968 | Cramer et al. | 161/1 |
| 3,449,103 | 6/1969 | Stookey | 65/30 |
| 3,484,241 | 12/1969 | Evleth et al. | 96/49 |
| 3,511,653 | 5/1970 | Wiebe | 96/27 |
| 3,679,415 | 7/1972 | McNally, Jr. | 96/68 |
| 3,703,388 | 11/1972 | Araujo et al. | 106/47 R |
| 3,765,896 | 10/1973 | Fox | 96/89 |
| 3,873,313 | 3/1975 | Horst et al. | 430/312 |
| 3,965,278 | 6/1976 | Duinker | 430/28 |
| 3,982,439 | 9/1976 | Feng et al. | 430/312 |
| 4,025,191 | 5/1977 | Seward | 355/71 |
| 4,028,113 | 6/1977 | Sturmer | 96/84 R |
| 4,123,272 | 10/1978 | Quinn | 96/35.1 |
| 4,191,573 | 3/1980 | Toyama et al. | 430/166 |
| 4,211,834 | 7/1980 | Lapadula et al. | 430/326 |
| 4,225,661 | 9/1980 | Muzyczko | 430/156 |
| 4,276,369 | 6/1981 | Tsuda et al. | 430/326 |
| 4,352,870 | 10/1982 | Howard et al. | 430/271 |
| 4,359,524 | 11/1982 | Masuda et al. | 430/522 |
| 4,362,809 | 12/1982 | Chen et al. | 430/312 |
| 4,370,405 | 1/1983 | O'Toole et al. | 430/312 |
| 4,373,018 | 2/1983 | Reichmanis et al. | 430/312 |
| 4,394,437 | 7/1983 | Bergendahl et al. | 430/312 |
| 4,409,319 | 10/1983 | Colacino et al. | 430/326 |
| 4,411,978 | 10/1983 | Laridon et al. | 430/157 |
| 4,447,521 | 5/1984 | Tiers et al. | 430/337 |
| 4,464,458 | 8/1984 | Chow et al. | 430/312 |
| 4,504,566 | 3/1985 | Dueber | 430/156 |
| 4,524,121 | 6/1985 | Gleim et al. | 430/156 |
| 4,533,624 | 8/1985 | Sheppard | 430/312 |
| 4,548,896 | 10/1985 | Sabongi et al. | 430/332 |
| 4,555,471 | 11/1985 | Barzynski et al. | 430/273 |
| 4,557,797 | 12/1985 | Fuller et al. | 430/312 |
| 4,563,241 | 1/1986 | Tanaka et al. | 430/313 |
| 4,567,132 | 1/1986 | Fredericks et al. | 430/312 |
| 4,576,901 | 3/1986 | Stahlhofen et al. | 430/325 |
| 4,578,344 | 3/1986 | Griffing et al. | 430/312 |
| 4,581,323 | 4/1986 | Fisher et al. | 430/512 |
| 4,594,312 | 6/1986 | Sabongi et al. | 430/339 |
| 4,600,683 | 7/1986 | Greco et al. | 430/270 |
| 4,663,275 | 5/1987 | West et al. | 430/271 |
| 4,677,049 | 6/1987 | Griffing et al. | 430/339 |
| 4,702,996 | 10/1987 | Griffing et al. | 430/325 |
| 4,704,347 | 11/1987 | Vollanbrock et al. | 430/156 |
| 4,732,836 | 5/1988 | Potvin et al. | 430/192 |
| 4,732,837 | 5/1988 | Potvin et al. | 430/192 |

FOREIGN PATENT DOCUMENTS

| | | |
|---|---|---|
| 0164248 | 12/1985 | European Pat. Off. ............ 430/192 |
| 156740 | 9/1982 | Fed. Rep. of Germany . |
| 54-109423 | 2/1978 | Japan . |
| 1154716 | 6/1966 | United Kingdom . |
| 2032125 | 4/1980 | United Kingdom . |
| 2135793 | 1/1984 | United Kingdom . |

OTHER PUBLICATIONS

Hatzakis, M., "Multilayer Resist Systems for Lithography", *Solid State Technology*, Aug., 1981.
Ong, E. et al., "Multilayer Resists for Fine Line Optical Lithography," *Solid State Technoligy*, Jun., 1984, pp. 155–160.
Research Disclosure, Jan. 1979, pp. 22-4, 23, 24.

*Primary Examiner*—Charles L. Bowers, Jr.
*Attorney, Agent, or Firm*—Plottel & Roberts

[57] ABSTRACT

A process for forming a multi-level positive working photosensitive element. One forms a composition containing an alkali soluble resin, an o-quinonediazide compound and an in-situ generated acid catalyzed crosslinker in a solvent mixture. After coating on a substrate, drying and partially cross-linking the first layer, a second positive working light sensitive layer is applied. Each light sensitive layer is activated by u.v. radiation in different parts of the spectrum. The top layer is imagewise exposed and developed to form a mask. The second layer is flood exposed through this mask and developed. Each development is conducted with an aqueous alkaline solution.

16 Claims, No Drawings

POSITIVE WORKING MULTI-LEVEL PHOTORESIST

BACKGROUND OF THE INVENTION

The present invention relates generally to radiation sensitive photoresist compositions and particularly to compositions containing aqueous alkali soluble resins together with naphthoquinone diazide sensitizing agents.

It is well known in the art to produce positive photoresist formulations such as those described in U.S. Pat. Nos. 3,666,473, 4,115,128 and 4,173,470. These include alkali-soluble phenol-formaldehyde novolak resins together with light-sensitive materials, usually a substituted diazonaphthoquinone compound. The resins and sensitizers are dissolved in an organic solvent or mixture of solvents and are applied as a thin film or coating to a substrate suitable for the particular application desired.

The resin component of these photoresist formulations is soluble in aqueous alkaline solutions, but the naphthoquinone sensitizer acts as a dissolution rate inhibitor with respect to the resin. Upon exposure of selected areas of the coated substrate to actinic radiation, however, the sensitizer undergoes a radiation induced structural transformation and the exposed areas of the coating are rendered more soluble than the unexposed areas. This difference in solubility rates causes the exposed areas of the photoresist coating to be dissolved when the substrate is immersed in an alkaline developing solution while the unexposed areas are largely unaffected, thus producing a positive relief pattern on the substrate.

In most instances, the exposed and developed photoresist on the substrate will be subjected to treatment by a substrate-etchant solution. The photoresist coating protects the coated areas of the substrate from the etchant and thus the etchant is only able to etch the uncoated areas of the substrate, which in the case of a positive photoresist, correspond to the areas that were exposed to actinic radiation Thus, an etched pattern can be created on the substrate which corresponds to the pattern on the mask, stencil, template, etc., that was used to create selective exposure patterns on the coated substrate prior to development.

The relief pattern of the photoresist on the substrate produced by the method described above is useful for various applications including as an exposure mask or a pattern such as is employed in the manufacture of miniaturized integrated electronic components.

The properties of a photoresist composition which are important in commercial practice include the photospeed of the resist, development contrast, resist resolution, and resist adhesion.

Resist resolution refers to the capacity of a resist system to reproduce the smallest features from the mask to the resist image on the substrate.

In many industrial applications, particularly in the manufacture of miniaturized electronic components, a photoresist is required to provide a high degree of resolution for very small features (on the order of two micron or less).

The ability of a resist to reproduce very small dimensions, on the order of a micron or less, is extremely important in the production of large scale integrated circuits on silicon chips and similar components. Circuit density on such a chip can only be increased, assuming photolithography techniques are utilized, by increasing the resolution capabilities of the resist.

Photoresists are generally categorized as being either positive working or negative working. In a negative working resist composition, the imagewise light struck areas harden and form the image areas of the resist after removal of the unexposed areas with a developer. In a positive working resist the exposed areas are the non-image areas. The light struck parts are rendered soluble in aqueous alkali developers. While negative resists are the most widely used for industrial production of printed circuit boards, positive resists are capable of much finer resolution and smaller imaging geometries. Hence positive resists are the choice for the manufacture of densely packed integrated circuits.

In the normal manner of using a positive photoresist, a single layer of this material is imaged to give a mask on the substrate, which can further be etched with a suitable etchant or used for deposition of materials, such as metals. However, due to the limitations of optical imaging systems, resolution of small patterns, on the order of 2um or less, is limited, particularly if topography is present on the substrate. It was discovered by B.J. Lin and T.H.P. Chang, J. Vac. Sci. Tech. 1979, 16, p1669, that this resolution can be further improved by using multilevel systems to form a portable conformable mask.

In multilevel lithography a relatively thick layer of photoresist is used such that the substrate is covered with a flat layer of the photoresist. A different type of photoresist, in particular, one absorbing at a different wavelength as compared to the bottom layer, is then placed on top. This top layer is imaged through a mask using the actinic wavelength for the top layer resist. The image is developed using an appropriate developer. The top layer image can now be used as a portable conformable mask for imaging the bottom layer by flood exposing the system at the actinic wavelength of bottom photoresist. This system represents a simple bilevel scheme.

However, if undesirable intermixing or scumming is observed between the two photoresist layers then another barrier layer may be added between these two layers. The barrier layer may be an organic polymer that does not mix with either of the two layers, such as polyvinyl alcohol, or be an inorganic layer, such as silicon oxide or silicon nitride. From a processability point of view a bilevel system is more attractive than a trilevel one although a trilevel system is also contemplated by this invention.

The present invention relates to a multilevel system, where a layer of a first positive photoresist is coated onto a substrate. It is necessary for this invention that the bottom layer of photoresist be one capable of a controllable degree of crosslinking. The compositions described in U.S. patent applications Ser. No. 764,700, filed Aug. 12, 1985; Ser. No. 889,032, filed July 23, 1986; and Ser. No. 895,609, filed Aug. 11, 1986 are preferred and these applications are incorporated herein by reference. These compositions undergo tone inversion from positive to negative if the exposure energy is low, on the order of about 5-50 mJ/cm$^2$, and an appropriate post-exposure bake is then used. The dosage and the temperature of the post-exposure bake determine the extent of crosslinking taking place in the photoresist and thus the dissolution properties of the image reversed photoresist. If no post-exposure bake is used, the photoresist behaves as a conventional positive resist. Crosslinking can also be introduced with only a bake and without exposure if a suitable crosslinking additive is used such that the system requires no photogenerated acidic species to induce crosslinking. For the purposes of this invention the conditions used for crosslinking are such that substantially no intermixing is observed when the top layer of photoresist is in place. This lower level resist is soft-baked at a temperature to largely remove the solvent from the film. The film is then flood exposed with u.v. light and baked such that the material is sufficiently crosslinked to prevent intermixing when the top layer of photoresist is deposited. The actinic wavelength for this photoresist may be, for example, 300-410nm.

If the substrate is highly reflective or contains topography, a dye may be added to the resist which forms the bottom layer. The absorption of the dye should be at the same wavelength as that used to image the top layer. The concentration of the dye should be sufficient to eliminate reflections from the substrate when imaging the top layer.

On top of the crosslinked lower resist is deposited a second photoresist that is actinic at a wavelength which is not absorbed by the sensitizer of the bottom resist. This may be any wavelength excluding, for example, 300nm to 410nm. In one case this could be 436nm. To the upper resist may be added a dye that is used to form a mask for the bottom layer, i.e. a dye that absorbs between 300nm to 410nm. The concentration of this dye should preferably be sufficient such that for the desired film thickness (300 $\mu$m to 410 nm) the transmission at the exposure wavelength of the bottom resist is preferably less than 1%. This is to enable the top layer to behave as an efficient mask.

Imaging of the top layer may be done with, for example, 436nm filtered mercury light through a mask. The image is then developed with an aqueous alkaline developer, e.g., AZ 400K available commercially from American Hoechst Corporation. The complete system is then flood exposed with light at the actinic wavelength of the bottom resist. The wavelength of the light should also be such that the light is sufficiently absorbed by the dye in the patterned top layer to reduce the transmission in the masked areas to less than about one percent. The exposure dose has to be sufficiently high to convert enough of the naphthoquinone sensitizer to an indene carboxylic acid to overcome the insolubility of the previously crosslinked bottom resist. Exposure doses of about 100mJ/cm$^2$ to about 300mJ/cm$^2$ are sufficient. The bottom layer is then developed with an aqueous alkaline developer. Thus the image of the mask is transferred "positively" to the substrate if the top resist is a positive acting one.

This system has an advantage over other current bilevel systems in that no organic solvents need be used in the development stage. Aqueous alkaline developers may be used to develop both layers of this multilayer system. The bottom layer does not dissolve at an appreciable rate, since the bottom layer is partially crosslinked. In addition, since it is a bilevel system, it is much simpler than a trilevel one and requires less processing. Also without any further processing step the bottom layer possesses greater thermal stability than a conventionally positively imaged photoresist would, since it is partially crosslinked. This enhanced thermal stability is important for any etching where temperatures in the area of 150° C. can be reached.

The invention uses a unique partially cross-linkable chemical composition, which when processed in a slightly modified manner to the usual and customary method of lithographic processing, yields a totally unexpected positive working bi-level resist system.

Among the advantages realized by this highly desirable result are improvement in the relationship between exposure energy and resulting line width, improvement in developed image resolution, substantial elimination of reflective notching and a totally aqueous developable system.

SUMMARY OF THE INVENTION

A process for forming a multi-level positive working photosensitive element. One forms a composition containing an alkali soluble resin, an o-quinonediazide compound and an in-situ generated acid catalyzed crosslinker in a solvent mixture. After coating on a substrate, drying and partially cross-linking the first layer, a second positive working light sensitive layer is applied. Each light sensitive layer is activated by u.v. radiation in different parts of the spectrum. The top layer is imagewise exposed and developed to form a mask. The second layer is flood exposed through this mask and developed. Each development is conducted with an aqueous alkaline solution.

The invention provides a process for preparing a positive working photographic element which comprises in order:

(a) forming a first photosensitive composition which comprises (i) from about 1% to about 25% based on the weight of the solid parts of the composition of a photosensitive compound having the formula

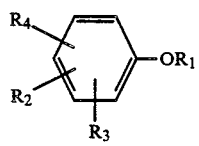

wherein
$R_1$ = 1,2-benzoquinone-2-diazide-4-sulfonyl; 1,2-naphthoquinone-2-diazide-4-sulfonyl; or 1,2-anthraquinone-2-diazide-4-sulfonyl
$R_2$ = H, $R_7$, $OR_6$ or

$R_3$ = H, $R_7$, $OR_6$ or

$R_4$ = H, $R_7$, $OR_6$ or

$R_6$ = H, alkyl, aryl, aralky or $R_1$
$R_7$ = alkyl, aryl or aralkyl (ii) from about 75% to about 99% based on the weight of the solid parts of the composition of a novolak, and/or polyvinyl phenol resin; and (iii) from about 0.5% to about 20% based on the weight of the solid parts of said composition of a crosslinking compound which, when in the presence of that amount and strength of the acid generated when said diazide is exposed to actinic radiation, is capable of crosslinking said resin under the application of the heating conditions of step (d); and (iv) sufficient solvent to dissolve the foregoing composition components; and (b) coating said first composition on a suitable substrate; and (c) heat treating said coated substrate at a temperature of from about 20° C. to about 100° C. until enough of said solvent is dried off to render it non-tacky; and (d) non-imagewise exposing said composition overall to sufficient actinic radiation and sufficient heat to partially cross-link said composition while substantially retaining its photosensitivity; and (e) coating said first photosensitive composition with a second photosensitive composition comprising an o-quinone diazide and a novolak and/or polyvinyl phenol resin, wherein said first photosensitive composition and said second photosensitive composition are reactive to ultraviolet radiation at substantially different wavelengths; and, (f) imagewise exposing said second photosensitive composition to actinic radiation and developing to form an image mask; and (g) exposing said first photosensitive composition to actinic radiation through said image mask and developing to remove the exposed portion of said first photosensitive composition.

According to the present invention there is provided: a process for preparing a positive working photographic element which comprises in order:

(a) forming a first photosensitive composition which comprises (i) from about 1% to about 25% based on the weight of the solid parts of the composition of a photosensitive compound having the formula represented by the general formulae (1), (2) or (3):

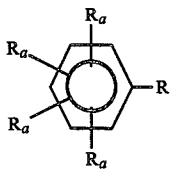 (1)

wherein $R_2$ is H, —X—$R_b$ or

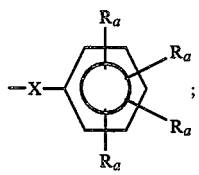

X is a single C—C bond, —O—, —S—, —SO$_2$—,

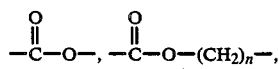

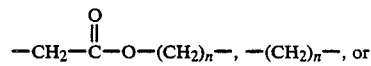

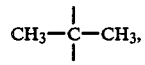

n is 1 or 2, $R_a$ is H, —OH, —OY, —OZ, halogen or lower alkyl, with at least one $R_a$ radical being -OY and at least one thereof being —OZ, $R_b$ is H, alkyl, aryl, substituted alkyl, or substituted aryl;

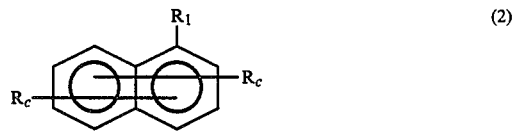 (2)

wherein $R_1$ is H, or

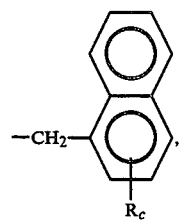, $R_c$ is H, —OH, —OY or —OZ, with at least one $R_c$ radical being —OY and at least one thereof being —OZ; and

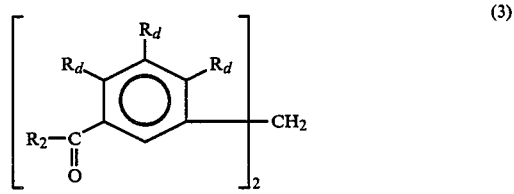 (3)

wherein $R_2$ is H, alkyl, aryl, substituted alkyl, or substitute aryl, $R_d$ is —OH, —OY or —OZ with at least one $R_d$ radical being —OY and at least one thereof being —OZ;

wherein Y is 1,2-naphthoquinonediazide-4-sulfonyl and Z is 1,2-naphthoquinone-diazide-5-sulfonyl or —W—$R_3$, where W is

or —SO$_2$—, and $R_3$ is alkyl, aryl, substituted alkyl or substituted aryl;

(ii) from about 75% to about 99% based on the weight of the solid parts of the composition of a novolak, and/or polyvinyl phenol resin; and (iii) from about 0.5% to about 20% based on the weight of the solid parts of said composition of a crosslinking compound which, when in the presence of that amount and strength of the acid generated when said diazide is exposed to actinic radiation, is capable of crosslinking said resin under the application of the heating conditions of step (d); and (iv) sufficient solvent to dissolve the foregoing composition components; and (b) coating said first composition on a suitable substrate; and (c) heat treating said coated substrate at a temperature of from about 20° C. to about 100° C. until enough of said solvent is dried off to render it non-tacky; and (d) non-imagewise exposing said composition overall to sufficient actinic radiation and sufficient heat to partially cross-link said composition while substantially retaining its photosensitivity; and (e) coating said first photosensitive composition with a second photosensitive composition comprising an o-quinone diazide and a novolak and/or polyvinyl phenol resin, wherein said first photosensitive composition and said second photosensitive composition are reactive to ultraviolet radiation at substantially different wavelengths; and, (f) imagewise exposing said second photosensitive composition to actinic radiation and developing to form an image mask; and (g) exposing said first photosensitive composition to actinic radiation through said image mask and developing to remove the exposed portion of said first photosensitive composition.

According to the present invention there is provided: a process for preparing a positive working photographic element which comprises in order:

(a) forming a first photosensitive composition which comprises (i) from about 1% to about 25% based on the weight of the solid parts of the photosensitizer composition comprising the condensation product of:

(I) a phenolic compound selected from the group consisting of:—

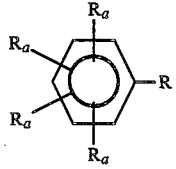 (A)

wherein R is H, —X—$R_b$, or

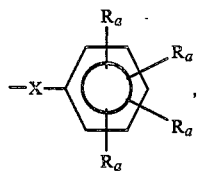, $R_a$ is H, —OH, halogen or lower alkyl, with at least two and not greater than six $R_a$ radicals being —OH, X is a single C—C bond, —O—, —S—, —$SO_2$—,

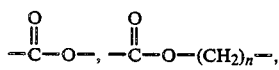

-continued

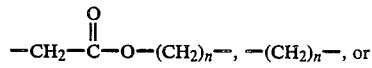

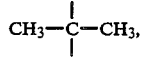

p n is 1 or 2, $R_b$ is H, alkyl, aryl, substituted alkyl or substituted aryl;

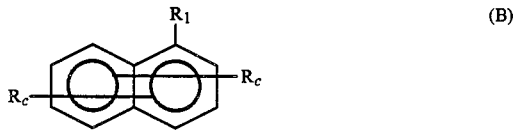 (B)

wherein $R_1$ is H or

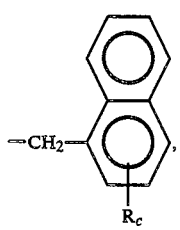, $R_c$ is H or —OH with at least two $R_c$ radicals being —OH; and

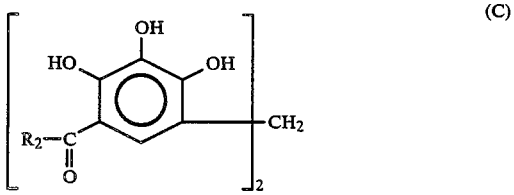 (C)

wherein $R_2$ is H, alkyl, aryl, substituted alkyl, or substituted aryl;

(II) a 1,2-naphthoquinonediazide-4-sulfonic acid (Diazo 1); and (III) a 1,2-naphthoquinonediazide-5-sulfonic acid (Diazo 2) and/or an organic acid halide represented by the formula:

W—$R_3$ wherein W is

or —$SO_2$—V, V is halogen, $R_3$ is alkyl, aryl, substituted alkyl or substituted aryl;

wherein the molar ratio of the amount of Diazo 1 reacted to the amount of Diazo 2 and/or organic acid reacted is in the range of from about 1:1 to about 39:1;

(ii) from about 75% to about 99% based on the weight of the solid parts of the composition of a novolak, and/or polyvinyl phenol resin; and (iii) from about 0.5% to about 20% based on the weight of the solid parts of said composition of a crosslinking compound which, when in the presence of that amount and strength of the acid generated when said diazide is exposed to actinic radiation, is capable of crosslinking said resin under the application of the heating conditions of step (d); and (iv) sufficient solvent to dissolve the foregoing composition components; and (b) coating said first composition on a suitable substrate; and (c) heat treating said coated substrate at a temperature of from about 20° C. to about 100° C. until enough of said solvent is dried off to render it non-tacky; and (d) non-imagewise exposing said composition overall to sufficient actinic radiation and sufficient heat to partially cross-link said composition while substantially retaining its photosensitivity; and (e) coating said first photosensitive composition with a second photosensitive composition comprising an o-quinone diazide and a novolak and/or polyvinyl phenol resin, wherein said first photosensitive composition and said second photosensitive composition are reactive to ultraviolet radiation at substantially different wavelengths; and, (f) imagewise exposing said second photosensitive composition to actinic radiation and developing to form an image mask; and (g) exposing said first photosensitive composition to actinic radiation through said image mask and developing to remove the exposed portion of said first photosensitive composition.

DETAILED DESCRIPTION OF THE PREFERRED EMBODIMENT

As a first step in the production of the photographic element of the present invention, one coats and dries the foregoing first photosensitive composition on a suitable substrate. The composition contains a solvent, crosslinking agent, binding resin and a 1,2-quinonediazide-4-sulfonyl group containing photosensitizer. The binding resins include the classes known as the novolaks and polyvinyl phenols.

The production of novolak resins, which may be used for preparing photosensitive compositions, is well known in the art. A procedure for their manufacture is described in *Chemistry and Application of Phenolic Resins*, Knop A. and Scheib, W.; Springer Verlag, New York, 1979 in Chapter 4 which is incorporated herein by reference. Polyvinyl phenols are taught in U.S. Pat. Nos. 3,869,292 and 4,439,516, which are incorporated herein by reference. Similarly, the use of o-quinone diazides is well known to the skilled artisan as demonstrated by *Light Sensitive Systems*, Kosar, J.; John Wiley & Sons, New York, 1965 in Chapter 7.4 which is also incorporated herein by reference. These sensitizers which comprise a component of the present resist compositions of the present invention are preferably selected from the group of substituted diazonaphthoquinone sensitizers which are conventionally used in the art in positive photoresist formulations. Such sensitizing compounds are disclosed, for example, in U.S. Pat. Nos. 2,797,213; 3,106,465; 3,148,983; 3,130,047; 3,201,329; 3,785,825; and 3,802,885, which are incorporated herein by reference.

For the first photosensitive composition, the photosensitizer is a 1,2-quinonediazide-4-sulfonic acid ester of a phenolic derivative. It presently appears that the number of fused rings is not important for this invention but the position of the sulfonyl group is important. That is, one may use benzoquinones, naphthoquinones or anthroquinones as long as the oxygen is in the position, the diazo is in the 2 position, and the sulfonyl group is in the 4 position. Likewise the phenolic member to which it is attached does not appear to be important. For example it can be a cumylphenol derivative as taught in U.S. Pat. No. 3,640,992 or it can be a mono-, di-, or trihydroxyphenyl alkyl ketone or benzophenone as shown in U.S. Pat. No. 4,499,171. Both of these patents are incorporated herein by reference.

As a generalized formula, the quinonediazides of the first photosensitive composition layer may be represented by:

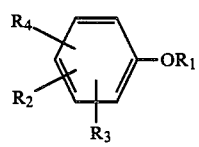

wherein
$R_1 =$ 1,2-benzoquinone-2-diazide-4-sulfonyl; 1,2-naphthoquinone-2-diazide-4-sulfonyl; or 1,2-anthraquinone-2-diazide-4-sulfonyl
$R_2 =$ H, $R_7$, $OR_6$ or

$R_3 =$ H, $R_7$, $OR_6$ or

$R_4 =$ H, $R_7$, $OR_6$ or

$R_6 =$ H, alkyl, aryl, aralky or $R_1$
$R_7 =$ alkyl, aryl or aralkyl

Useful photosensitizers include (1,2)naphthoquinonediazide-4-sulfonyl chloride condensed with phenolic compounds such as hydroxybenzophenones especially trihydroxybenzophenone and more particularly 2,3,4-trihydroxybenzophenone; 2,3,4-trihydroxyphenyl pentyl ketone 1,2-naphthaquinone-2-diazide-4-sulfonic acid triester or other alkyl phenones; 2,3,4-trihydroxy-3'-methoxybenzophenone 1,2-naphthaquinone-2-diazide-4-sulfonic acid triester; 2,3,4-trihydroxy-3'-methyl benzophenone 1,2-naphthaquinone-2-diazide-4 sulfonic acid triester; and 2,3,4-trihydroxybenzophenone 1,2-naphthaquinone-2-diazide-4-sulfonic acid triester.

Other useful photosensitive compounds and photosensitizer compositions of this invention may be obtained by condensing phenolic compounds with a mixture of Diazo 1 and Diazo 2 and/or organic acid halides. The molar ratio of the amount of Diazo 1 to the amount of Diazo 2 and/or organic acid halide in the mixture may be in the range of from about 1:1 to about 39:1, preferably from about 4:1 to about 19:1, or more preferably from about 93:7 to about 85:15. For example, one mole of 2,3,4-trihydroxybenzo-phenone may be condensed with a 9:1 mixture of 2.7 moles of Diazo 1 and 0.3 moles of Diazo 2 to yield a photosensitizer composition comprising compounds having the formula:

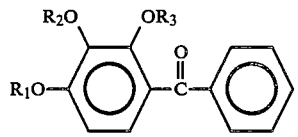

where $R_1$, $R_2$ and $R_3$ may independently be either 1,2-naphthoquinonediazide-4-sulfonyl or 1,2-naphthoquinone-diazide-5-sulfonyl.

Ths photosenstive compounds may be represented by general formulae (1), (2) and (3):

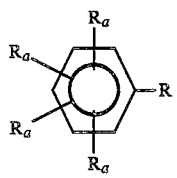 (1)

wherein R is H, —X—$R_b$ or

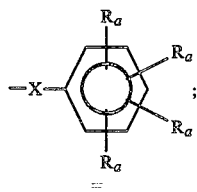

X is a single C—C bond, —O—, —S—, —SO$_2$—,

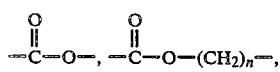

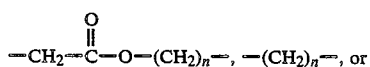

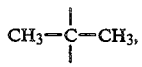

n is 1 or 2, $R_a$ is H, —OH, —OY, —OZ, halogen, preferably Cl or Br, or lower alkyl, preferably lower alkyl having 1-4 carbon atoms, with at least one $R_a$ radical being —OY and at least one thereof being —OZ, $R_b$ is H, alkyl, aryl, substituted alkyl, or substituted aryl; preferably alkyl having 1-20 carbon atoms, more preferably 1-12 carbon atoms, preferably aryl being phenyl or naphthyl, alkyl or aryl may be substituted with lower alkyl having 1-4 carbon atoms, lower alkoxy having 1-4 carbon atoms, or halogen atoms, preferably Cl or Br;

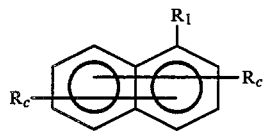 (2)

wherein $R_1$ is H, or

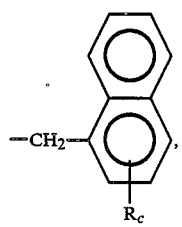, $R_c$ is H, —OH, —OY or —OZ, with at least one $R_c$ radical being —OY and at least one thereof being —OZ; and

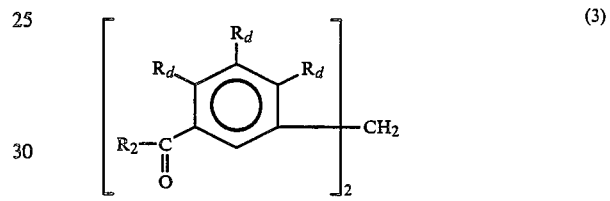 (3)

wherein $R_2$ is H, alkyl, aryl, substituted alkyl, or substituted aryl, $R_d$ is —OH, —OY or —OZ with at least one $R_d$ radical being —OY and at least one thereof being —OZ; the alkyl radicals $R_2$ may be straight-chain or branched and may be substituted with halogen atoms or lower alkoxy groups having 1-4 carbon atoms, preferably the alkyl radicals have 1-20 carbon atoms; the aryl radicals $R_2$ are preferably mononuclear and may be substituted with lower alkyl or alkoxy groups having 1-4 carbon atoms or with halogen atoms, preferably the aryl radicals have 1 to 10 carbon atoms; compounds in which $R_2$ is an aryl radical are particularly preferred and compounds in which the aryl radical is a phenyl radical are especially preferred;

wherein Y is 1,2-naphthoquinonediazide-4-sulfonyl and Z is a 1,2—naphthoquinonediazide—5-sulfonyl or —W—$R_3$, where W is

or —SO—, and $R_3$ is alkyl, aryl, substituted alkyl or substituted aryl; the alkyl radicals $R_3$ may be straight-chain or branched and may be substituted with halogen atoms, preferably Br or Cl, or lower alkoxy groups having 1-4 carbon atoms, preferably alkyl having 1-20 carbon atoms; the aryl radicals $R_3$ are preferably mononuclear and may be substituted with lower alkyl or alkoxy groups having 1-4 carbon atoms or with halogen atoms, preferably Br or Cl, preferably aryl radicals having 6-10 carbon atoms; phenyl radicals are preferred; alkyl radicals are particularly preferred and lower alkyl radicals having 1-6 carbon atoms are especially preferred.

These photosensitive compounds may be prepared, for example, in the manner as herein described for the preparation of the photosensitizer compositions. The compounds may be isolated and purified as desired.

The photosensitizer compositions (comprising inter alia the photosensitive compounds disclosed herein) may be obtained by condensing phenolic compounds with a mixture of Diazo 1 and Diazo 2 and/or organic acid halides. The Diazo 1 component and the Diazo 2 and/or organic acid halide component of the mixture may be condensed either sequentially or concurrently with the phenolic compounds.

The Diazo 1/Diazo 2-organic acid mixture may be reacted preferably in stoichiometric quantities with the hydroxyl-bearing compounds. However, the phenolic compounds need not be completely esterified and less than stoichiometric quantities of the Diazo and organic acid halide compounds may be condensed with the phenolic compounds provided that the molar ratio of Diazo 1 to Diazo 2 and/or organic acid halide reacted is within the ranges specified herein. The total amount of Diazo 1 and Diazo 2 and/or organic acid halide reacted with the phenolic compounds should be sufficient to produce a photosensitizer composition capable of inhibiting the dissolution rate of an alkali-soluble resin.

The phenolic compounds which may be condensed with the Diazo /. Diazo 2-organic acid mixture are represented by the general formulae (A), (B) and (C):

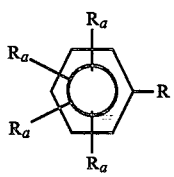 (A)

wherein R is —H, —OH, —X—$R_b$, or

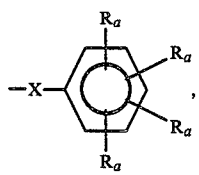, $R_a$ is H, —OH, halogen, preferably Cl or Br, or lower alkyl, preferably lower alkyl having 1 to 4 carbon atoms; with at least two and not greater than six $R_a$ radicals being —OH, X is a single C—C bond, —O—, —S—, —SO$_2$—,

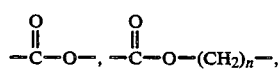

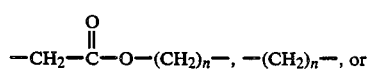

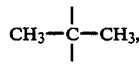

n is 1 or 2, $R_b$ is H, alkyl, aryl, substituted alkyl or substituted aryl; preferably alkyl having 1–20 carbon atoms, more preferably 1–12 carbon atoms, preferably aryl being phenyl or naphthyl, alkyl or aryl may be substituted with lower alkyl having 1–4 carbon atoms, lower alkoxy having 1–4 carbon atoms, or halogen atoms, preferably Cl or Br;

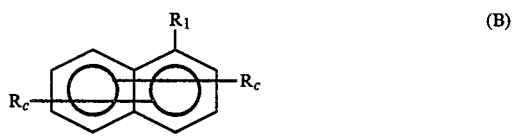 (B)

wherein $R_1$ is H or

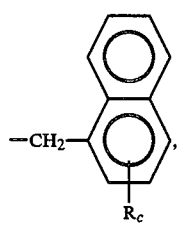, $R_c$ is H or —OH with at least two $R_c$ being —OH; and

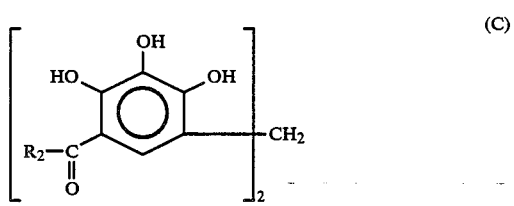 (C)

wherein $R_2$ is H, alkyl, aryl, substituted alkyl, or substituted aryl; the alkyl radicals $R_2$ may be straight-chain or branched and may be substituted with halogen atoms or lower alkoxy groups having 1–4 carbon atoms, preferably the alkyl radicals have 1–20 carbon atoms; the aryl radicals $R_2$ are preferably mononuclear and may be substituted with lower alkyl or alkoxy groups having 1–4 carbon atoms or with halogen atoms, preferably the aryl radicals have 1 to 10 carbon atoms; compounds in which $R_2$ is an aryl radical are particularly preferred and compounds in which the aryl radical is a phenyl radical are especially preferred.

Among the phenolic compounds represented by the general formula (I) are: hydroxyl-bearing benzene compounds such a 1,2-dihydroxy-benzene, 1,3-dihydroxybenzene, 1,4-dihydroxybenzene, 1,2,3-trihydroxybenzene, 1,2,4-trihydroxybenzene, 1,3,5-trihydroxybenzene, and the like; dihydroxybenzophenones such as 2,2'-dihydroxybenzophenone, 2,3'-dihydroxybenzophenone, 2,4-dihydroxybenzophenone, 2,4'-dihydroxybenzophenone, 2,5-dihydroxybenzophenone, 3,3'-dihydroxybenzophenone, 4,4'-dihydroxybenzophenone, and the like; trihydroxybenzophenones such as 2,2',6-trihydroxybenzophenone, 2,3,4-trihydroxybenzophenone, 2,4,4'-trihydroxybenzophenone, 2,4,6-trihydroxybenzophenone, 3,4,5-trihydroxybenzophenone, and the like; tetrahydroxybenzophenones such as 2,2'3,4-tetrahydroxybenzophenone, 2,2',4,4'-tetrahydroxybenzophenone, 2,2'4,6'-tetrahydroxybenzophenone, 2,2',5,6'-tetrahydroxybenzophenone, 2,3',4,4'-tetrahydroxybenzophenone, 2,3',4,6-tetrahydroxybenzophenone, 2,4,4',6-tetrahydroxybenzophenone, 3,3',4,4',-tetrahydroxybenzophenone, and the like; pentahydroxybenzophenones; hexahydroxybenzophenones; dihydroxy- and trihydroxy- phenyl alkyl ketones such as 2,4-dihydroxyphenyl alkyl ketones, 2,5-dihydroxyphenyl alkyl ketones, 3,4-dihydroxyphenyl alkyl ketones, 3,5-dihydroxyphenyl alkyl ketones, 2,3,4-trihydroxyphenyl alkyl ketones, 3,4,5-trihydroxyphenyl alkyl ketones, 2,4,6-trihydroxyphenyl alkyl ketones, and the like, preferably alkyl having 1-12 carbon atoms such as methyl, ethyl, butyl, n-hexyl, heptyl, decyl, dodecyl, and the like; dihydroxyphenyl aralkyl ketones; trihydroxyphenyl aralkyl ketones; dihydroxydiphenyls; trihydroxydiphenyls such as 2,2',4-trihydroxydiphenyl; tetrahydroxydiphenyls such as 2,2',4,4'-tetrahydroxydiphenyl; dihydroxydiphenyl oxides; dihydroxydibenzyl oxides; dihydroxydiphenyl alkanes, preferably lower alkanes such as methane, ethane, propane or the like; dihydroxybenzoic acid; trihydroxybenzoic acids; dihydroxy- and trihydroxy- benzoic acid alkyl esters, alkyl preferably having 1 to 12 carbon atoms, such as n-butyl 2,4-, 2,5-, 3,4- and 3,5-dihydroxybenzoate, 2,4,4-trimethylpentyl 2,4-dihydroxybenzoate, and the like; dihydroxy- and trihydroxy- benzoic acid phenyl esters; dihydroxy-, trihydroxy-, and tetrahydroxydiphenyl sulfides such as 4,4'dihydroxydiphenyl sulfide; dihydroxydiphenyl sulfones; and dihydroxy- and trihydroxy- phenyl naphthyl ketones such as 2,3,4-trihydroxyphenyl naphthyl ketone; and the like.

Examples of compounds of general formula (I) where at least one $R_a$ radical is halogen or lower alkyl include 2,4-dihydroxy-3,5-dibromobenzophenone; 5-bromo-2,4-dihydroxybenzoic acid and esters; 2,4,2',4'-tetrahydroxy-3,5,3',5'-tetrabromodiphenyl; 4,4'-dihydroxy-2,2'dimethyl-5,5'-di-tert.-butyl diphenyl; 4,4'-dihydroxy-2,2'dimethyl-5,5'-di-tert.-butyl diphenyl sulfide; 2,4,2',4'-tetrahydroxy-3,5,3'5'-tetrabromodiphenyl sulfone; and the like.

The preferred class of phenolic compounds of general formula (I) are the hydroxyl-bearing benzophenones and the especially preferred compounds are the trihydroxybenzophenones.

Among the phenolic compounds represented by general formula (II) are: dihydroxynaphthalenes such as 1,2-dihydroxynaphthalene, 1,4-dihydroxynaphthalene, 1,5-dihydroxynaphthalene, 1,6-dihydroxy-naphthalene, 1,7-dihydroxynaphthalene, 1,8-dihydroxynaphthalene, 2,3-dihydroxynaphthalene, 2,6-dihydroxynaphthalene, 2,7-dihydroxynaphthalene, and the like; dihydroxydinaphthylmethanes such as 2,2'dihydroxydinaphthylmethane, and the like. The dihydroxynaphthylenes are preferred. The hydroxyl groups of the dihydroxynaphthylenes may be either on the same nucleus or on different nucleii of the naphthalene moiety.

Among the phenolic compounds represented by general formula (III) are bis-(3-benzoyl-4,5,6-trihydroxyphenyl)-methane; bis-(3-acetyl-4,5,6-trihydroxyphenyl)-methane; bis-(3-propionyl-4,5,6-trihydroxyphenyl)-methane; bis-(3-butyryl-4,5,6-trihydroxyphenyl)-methane; bis-(3-hexanoyl-4,5,6-trihydroxyphenyl)-methane; bis-(3-heptanoyl-4,5,6-trihydroxyphenyl)-methane; bis-(3-decanoyl-4,5,6-trihydroxyphenyl)-methane; bis-(3-octadecanoyl-4,5,6-trihydroxyphenyl)-methane; and the like.

The organic acid halides which may be used to modify the Diazo 1 ester compounds may be represented by the formula:

$$W-R_3$$

wherein W is

or $-SO_2-V$, V is halogen, preferably Cl or Br, and $R_3$ is alkyl, aryl, substituted alkyl or substituted aryl; the alkyl radicals $R_3$ may be straight-chain or branched and may be substituted with halogen atoms, preferably Br or Cl, or lower alkoxy groups having 1-4 carbon atoms, preferably the alkyl radicals have 1-20 carbon atoms; the aryl radicals $R_3$ are preferably mononuclear and may be substituted with lower alkyl or alkoxy groups having 1-4 carbon atoms or with halogen atoms, preferably Br or Cl, preferably the aryl radicals have 6 to 10 carbon atoms, phenyl radicals are especially preferred; compounds in which $R_3$ is an alkyl radical are particularly preferred and compounds in which the alkyl radical is lower alkyl radical having 1-6 carbon atoms are especially preferred.

Among the organic acid halides represented by the above formula are alkyl sulfonyl halides such as methanesulfonyl chloride, ethanesulfonyl chloride, propanesulfonyl chloride, n-butanesulfonyl chloride, dodecanesulfonyl chloride, and the like; arylsulfonyl chlorides such as benzenesulfonyl chloride, naphthalenesulfonyl chlorides, and the like; acyl halides such as acetyl chloride, butanoyl chloride, valeryl chloride, benzoyl chloride, benzoyl bromide, naphthoyl chlorides, and the like.

The preferred organic acid halides are lower alkyl sulfonyl halides and lower alkyl acyl halides having 1-6 carbon atoms, and benzenesulfonyl halides and benzoyl halides. These acid halides may be substituted or unsubstituted.

The crosslinking compound is a compound, which when in the presence of that amount and strength of the acid generated when the diazide is exposed to actinic radiation, is capable of crosslinking the foregoing novolak, paravinylphenol or polyvinyl phenol resin. This occurs upon the application of sufficient heat to diffuse the acid to the crosslinking component but less heat than will decompose the diazide. The general class of such compounds are those capable of forming a carbonium ion under the foregoing acid and heat conditions. The preferred compounds are dimethylol paracresol as described in U.S. Pat. No. 4,404,272 which is incorporated by reference; methylmethoxy diphenyl ether, melamine formaldehyde resins and compounds and alkylated analogues thereof having 1 to about 3 monomer units such as those typically sold under the tradenames Cymel from American Cyanamid and Resimene from the Monsanto Company, for example hexamethylol melamine hexamethyl ether, resole resin and epoxy cresol novolak resin. In some cases these additives are sufficiently reactive that exposure to actinic radiation is not needed to induce crosslinking and only a heat treatment is necessary. This is found particularly for the Cymel resins.

The resole resins have the general formula

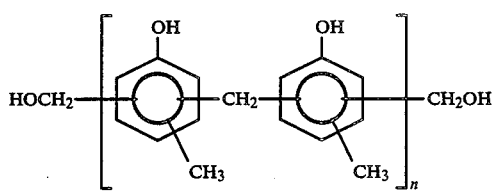

wherein n=1-15

The epoxy cresol novolak resins have the general formula

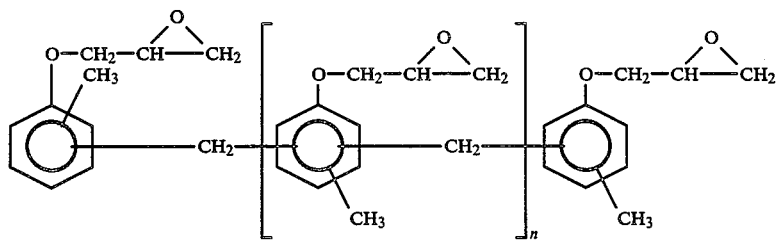

where n=1-10.

The first photosensitive composition is formed by blending the ingredients in a suitable solvent composition. In the preferred embodiment the resin is preferably present in the overall composition in an amount of from about 75% to about 99% based on the weight of the solid, i.e. non-solvent parts of the composition. A more preferred range of resin would be from about 80% to about 90% and most preferably from about 82% to about 85% by weight of the solid composition parts. The diazide is preferably present in an amount ranging from about 1% to about 25% based on the weight of the solid, i.e., non-solvent parts of the composition. A more preferred range of the diazide would be from about 1% to about 20% and more preferably from about 10% to about 18% by weight of the solid composition parts. The crosslinker is preferably present in an amount ranging from about 0.5% to about 20% based on the weight of the solid, i.e. non-solvent parts of the composition. A more preferred range would be from about 1% to about 10% and most preferably from about 3% to about 6% by weight of the solid composition parts. In manufacturing the composition the resin, crosslinker and diazide are mixed with such solvents as the propylene glycol alkyl ether acetate, butyl acetate, xylene, ethylene glycol monoethyl ether acetate, and propylene glycol methyl ether acetate, propylene glycol alkyl ether, for example propylene glycol methyl ether, or mixtures of the foregoing, among others.

Additives such as colorants, dyes, anti-striation agents, leveling agents, plasticizers, adhesion promoters, speed enhancers, solvents and such surfactants as non-ionic surfactants may be added to the solution of resin, sensitizer, cross-linker and solvent before the solution is coated onto a substrate.

Examples of dye additives that may be used together with the photoresist compositions of the present invention include Methyl Violet 2B (C.I. No. 42535), Crystal Violet (C.I. 42555), Malachite Green (C.I. No. 42000), Victoria Blue B (C.I. No. 44045) and Neutral Red (C.I. No. 50040) at one to ten percent weight levels, based on the combined weight of the solid parts of the composition. The dye additives help provide increased resolution by inhibiting back scattering of light off the substrate.

Anti-striation agents may be used up to five percent weight level, based on the combined weight of solids.

Plasticizers which may be used include, for example, phosphoric acid tri-($\beta$-chloroethyl)-ester; stearic acid; dicamphor; polypropylene; acetal resins; phenoxy resins; and alkyl resins at one to ten percent weight levels, based on the combined weight of solids. The plasticizer additives improve the coating properties of the material and enable the application of a film that is smooth and of uniform thickness to the substrate.

Adhesion promoters which may be used include, for example, $\beta$-(3,4-epoxy-cyclohexyl)-ethyltrimethoxysilane; p-methyl-disilane-methyl methacrylate; vinyltrichlorosilane; and $\gamma$-amino-propyl triethoxysilane up to a 4 percent weight level, based on the combined weight of solids.

Speed enhancers that may be used include, for example, picric acid, nicotinic acid or nitrocinnamic acid at a weight level of up to 20 percent, based on the combined weight of resin and solids. These enhancers tend to increase the solubility of the photoresist coating in both the exposed and unexposed areas, an thus they are used in applications when speed of development is the overriding consideration even though some degree of contrast may be sacrificed; i.e., while the exposed areas of the photoresist coating will be dissolved more quickly by the developer, the speed enhancers will also cause a larger loss of photoresist coating from the unexposed areas.

The coating solvents may be present in the overall composition in an amount of up to 95% by weight of the solids in the composition.

Non-ionic surfactants that may be used include, for example, nonylphenoxy poly(ethyleneoxy) ethanol; octylphenoxy(ethyleneoxy) ethanol; and dinonylphenoxy poly(ethyleneoxy) ethanol at up to 10 percent weight, based on the combined weight of solids.

The prepared resist solution can be applied to a substrate by any conventional method used in the photoresist art, including dipping, spraying, whirling and spin coating. When spin coating, for example, the resist solution can be adjusted as to the percentage of solids content in order to provide coating of the desired thickness given the type of spinning equipment utilized and the amount of time allowed for the spinning process. Suitable substrates include silicon, aluminum or polymeric resins, silicon dioxide, doped silicon dioxide, silicon nitride, tantalum, copper, polysilicon, ceramics and aluminum/copper mixtures.

The photoresist coatings produced by the above described procedure are particularly suitable for application to thermally grown silicon/silicon dioxide-coated wafers such as are utilized in the production of microprocessors and other miniaturized integrated circuit components. An aluminum/aluminum oxide wafer can be used as well. The substrate may also comprise various polymeric resins especially transparent polymers such as polyesters.

After the resist composition solution is coated onto the substrate, the substrate is temperature treated at approximately 20° to 100° C. This temperature treatment is selected in order to reduce and control the concentration of residual solvents in the photoresist while not causing substantial thermal degradation of the photosensitizer. In general one desires to minimize the concentration of solvents and thus this first temperature treatment is conducted to reduce the solvent content of the resist through evaporation and a thin coating of photoresist composition, on the order of a micron in thickness, remains on the substrate. This treatment is normally conducted at temperatures in the range of from about 20° C. to about 100° C. In a preferred embodiment the temperature is conducted at from about 50° C. to about 90° C. A more preferred range is from about 70° C. to about 90° C. This treatment is conducted until the rate of change of solvent removal becomes relatively insignificant. The temperature and time selection depends on the resist properties desired by the user as well as equipment used and commercially desired coating times. Commercially acceptable treatment times for hot plate treatment are those up to about 3 minutes, more preferably up to about 1 minute. In one example, a 30 second treatment at 90° C. is useful.

The coated substrate may then be exposed to actinic radiation, especially ultraviolet radiation, overall in a non-imagewise fashion in a manner well known to the skilled artisan. A low energy exposure may be used in the range of from about 5mJ/cm$^2$ to about 40mJ/cm$^2$, more preferably from about 20mJ/cm$^2$ to about 30mJ/cm$^2$.

The resist is then subjected to a post exposure second baking or heat treatment of from about 90° C. to about 160° C., preferably 100° C. to 150° C., more preferably 115° C. to 135° C. This heating treatment may be conducted with a hot plate system or convection oven at such temperature and for such time sufficient to partially crosslink the composition. For a hot plate system, this normally ranges from about 5 seconds to 30 seconds, more preferably from about 10 seconds to about 15 seconds. For an oven, the heat treatment may be about 15 minutes. The time selected depends on the choice of composition components, the thickness of the photoresist layer, and the substrate used. The baking treatment also converts the diazide to a carboxylic acid containing compound, for example indene carboxylic acid, which is soluble in aqueous alkali solutions. It is important that this exposure/heating step is conducted such that the composition retains the vast majority of its photosensitivity.

The selection of the first and second heat treatment temperatures and first and second heat treatment times may be selected and optimized by the properties which are desired by the end user.

On top of the first photosensitive layer is deposited a second photosensitive layer comprising a light sensitive, positive working o-quinonediazide, for example a 1,2-quinonediazide -4-, or -5- sulfonic acid ester of a phenolic derivative, plus a novolak and/or polyvinyl phenol resin. Such quinonediazides are well known in the art and include those hereinbefore described. This second photosensitive composition may likewise contain any of the aforementioned optional additives such as colorants, dyes, anti-striation agents, leveling agents, plasticizers, adhesion promoters, solvents, speed enhancers, and surfactants. The amounts of the constituent ingredients must be such that they provide a light sensitive composition capable of being substantially dissolved by an aqueous alkaline solution after being exposed to actinic radiation. It is important, however, that each of the first and second photosensitive compositions be reactive to actinic radiation in substantially different parts of the u.v. spectrum. This can be accomplished either through a selection of diazides having differential absorption spectra or by the inclusion of additives, such as dyes in one or the other layer.

The thusly formed bilevel resist is then imagewise exposed to actinic radiation in an amount and at a wavelength sufficient to render the exposed portions of the top photosensitive layer soluble in a suitable developer but which does not render the first photosensitive composition so soluble to any significant degree.

The exposed substrate is next substantially immersed in a suitable developing solution. The strength of the developer and time of development should be chosen such that the bottom layer does not dissolve at an appreciable rate. The solution is preferably agitated, for example, by nitrogen burst agitation. The substrates are allowed to remain in the developer until all, or substantially all, of the top photosensitive resist coating has dissolved from the exposed areas. Suitable developers include aqueous alkaline solutions such as those including sodium hydroxide, and tetramethylammonium hydroxide as are well known in the art.

The resultant article at this point comprises a portable conformable mask on the lower photosensitive layer. This mask on resist is then given an overall exposure to actinic radiation in an amount and at a wavelength sufficient to render the exposed portions of the first photosensitive layer soluble in a suitable developer. The portable conformable mask layer is of such an optical density that it is capable of absorbing the light impinged on it and preventing the exposure of the thereunder lying portions of the first photosensitive layer. Development is as given before.

After removal of the coated wafer substrate from the developing solution, an optional post-development heat treatment or bake may be employed to increase the coating's adhesion and chemical resistance to etching solutions and other substances. The post-development heat treatment can comprise the oven baking of the coating and substrate below the coating's softening point. In industrial applications, particularly in the manufacture of microcircuitry units on silicon/silicon dioxide-type substrates, the developed substrates may be treated with a buffered, hydrofluoric acid base etching solution or processed in a dry etching environment. The resist compositions of the present invention are resistant to acid-base etching solutions and provide effective protection for the unexposed resist-coating areas of the substrate.

The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

The following non-limiting examples serve to illustrate the invention:

EXAMPLE 1

The top layer photoresist has the following formulation:

| | w/w % |
|---|---|
| Cresol Novolac Resin | 15.7 |
| Photosensitizer comprising the condensation product of 2,3,4-trihydroxybenzophenone and 1,2-naphthoquinone-2-diazide-5-sulfonyl chloride | 5.2 |
| AZ Thinner | 76.7 |
| Bispyridyl ethylene dye | 2.4 |

The bottom layer photoresist has the following formulation:

| | w/w % |
|---|---|
| Cresol novolac resin | 23.1 |
| Propylene glycol monomethyl ether acetate | 72.9 |
| 2,3,4-trihydroxybenzophenone 1,2-naphthoquinone-2-diazide-4-sulfonic acid triester | 3.0 |
| Dimethylol p-cresol | 1.0 |

AZ Thinner is available from American Hoechst Corporation of Somerville, N.J.

Using the bottom layer photoresist, silicon wafers are coated at 2000 rpm and then soft-baked in a vented convection oven at 90° C. for 30 minutes. A broad band flood exposure is applied using a Oriel model 8089 exposure unit. The dosage is 30mJ/cm$^2$ as determined by an OAI radiometer for wavelengths between 365 and 436nm. The coated wafers are post exposure baked in a vented convection oven at 125° C. for 15 minutes. After the wafers cool to room temperature, the top layer photoresist is coated on the bottom layer photoresist at 2000 rpm and then soft-baked in a vented convection oven at 90° C. for 30 minutes.

Actinic exposure is applied using the Perkin Elmer 220 Micralign aligner through a glass photomask containing a resolution test pattern. The dosage is 180mJ/cm$^2$ as determined by an OAI radiometer for wavelengths between 365 and 436nm.

After developing the exposed wafers in AZ 400K Developer 1:3 dilution in an immersion mode for 90 seconds with slight agitation, the wafers are rinsed with deionized water and spin dried. The wafers are now examined using a scanning electron microscope at 10,000 magnification. A 2 μum single space and larger geometries are clearly seen to be completely open through the top layer. The top image may now be used as a portable conformable mask for imaging the bottom layer. The actinic wavelength for the bottom layer photoresist is 300–400nm. The wafers are flood exposed using an Optical Applied Inc. deep UV model 29D with a 310nm narrow band filter. The dosage is 126mJ/cm$^2$ as determined by an OAI radiometer for wavelengths centered at 310nm. The wafers are then developed in AZ 312 MIF developer in an immersion mode for 180 seconds with slight agitation. The wafers are immediately rinsed with DI water and spin dried. The wafers are again examined using a scanning electron microscope at 10,000 magnification. A 2 μm single space and larger geometries are clearly seen to be completely opened.

EXAMPLE 2

The top layer photoresist has the following formulation:

| | w/w % |
|---|---|
| Cresol novolac resin | 15.7 |
| Photosensitizier comprising the condensation product of 2,3,4-trihydroxybenzophenone and 1,2-naphthoquinone-2-diazide-5-sulfonyl chloride | 5.2 |
| AZ Thinner | 76.7 |
| Bispyridyl ethylene dye | 2.4 |

The bottom layer of the photoresist has the following formulation:

| | w/w % |
|---|---|
| Cresol Novolac Resin | 23.0 |
| Trihydroxy phenyl octyl ketone 1,2-naphthoquinone-2-diazide-4-sulfonic acid trisester | 3.0 |
| 2,6-dimethylol p-cresol | 1.3 |
| Propylene glycol monomethyl ether acetate | 72.7 |

Using the bottom layer photoresist, silicon wafers are coated at 2000 rpm and then soft-baked in a vented convection oven at 90° C. for 30 minutes. A broad band flood exposure is applied using a Oriel model 8089 exposure unit. The dosage is 10mJ/cm$^2$ as determined by an OAI radiometer for wavelengths between 365 and 436nm. The coated wafers are post exposure baked in a vented convection oven at 125° C. for 15 minutes. After the wafers cool to room temperature, the top layer photoresist is coated on the bottom layer photoresist at 3000 rpm and then soft-baked in a vented convection oven at 90° C. for 30 minutes.

Actinic exposure is applied using the Perkin Elmer 220 Micralign aligner through a glass photomask containing a resolution test pattern. The dosage is 250mJ/cm$^2$ as determined by an OAI radiometer for wavelengths between 365 and 436nm.

After developing the exposed wafers in AZ 400K Developer 1:3 dilution in an immersion mode for 90 seconds with slight agitation, the wafers are rinsed with deionized water and spin dried. The wafers are now examined using a scanning electron microscope at 10,000 magnification. A 2 μm single space and larger geometries are clearly seen to be completely open through the top layer. The top image may now be used as a portable conformable mask for imaging the bottom layer. The actinic wavelength for the bottom layer photoresist is 300 - 400nm. The wafers are flood exposed using an Optical Applied Inc. deep UV model 29D with a 310nm narrow band filter. The dosage is 200mJ/cm$^2$ as determined by an OAI radiometer for wavelengths centered at 310nm. The wafers are then developed in AZ 312 MIF developer in an immersion mode for 180 seconds with slight agitation. The wafers are immediately rinsed with DI water and spin dried. The wafers are again examined using a scanning electron microscope at 10,000 magnification. A 2 μm single space and larger geometries are clearly seen to be completely opened.

EXAMPLE 3

The top layer photoresist has the following formulation:

|  | w/w % |
|---|---|
| Cresol novolac resin | 12.6 |
| Photosensitizer comprising the condensation product of 2,3,4-trihydroxybenzophenone and 1,2-naphthoquinone-2-diazide-5-sulfonyl chloride | 4.1 |
| AZ Thinner | 79.3 |
| Bispyridyl ethylene dye | 4.0 |

The bottom layer photoresist has the following formulation:

|  | w/w % |
|---|---|
| Cresol novolac resin | 23.0 |
| 2,3,4-trihydroxyphenyl undecyl ketone 1,2-naphthoquinone-2-diazide-4-sulfonic acid triester | 3.1 |
| 2,6-dimethylol p-cresol | 1.3 |
| Propylene glycol monomethyl ether acetate | 72.6 |

Using the bottom layer photoresist, silicon wafers are coated at 2000 rpm and then soft-baked in a vented convection oven at 90° C. for 30 minutes. A broad band flood exposure is applied using a Oriel model 8089 exposure unit. The dosage is 10mJ/cm$^2$ as determined by an OAI radiometer for wavelengths between 365 and 436nm. The coated wafers are post exposure baked in a vented convection oven at 125° C. for 15 minutes. After the wafers cool to room temperature, the top layer photoresist is coated on the bottom layer photoresist at 3000 rpm and then soft-baked in a vented convection oven at 90° C. for 30 minutes.

Actinic exposure is applied using the Perkin Elmer 220 Micralign aligner through a glass photomask containing a resolution test pattern. The dosage is 250mJ/cm$^2$ as determined by an OAI radiometer for wavelengths between 365 and 436nm.

After developing the exposed wafers in AZ 400K Developer 1:3 dilution in an immersion mode for 60 seconds with slight agitation, the wafers are rinsed with deionized water and spin dried. The wafers are now examined using a scanning electron microscope at 10,000 magnification. A 2 μm single space and larger geometries are clearly seen to be completely open through the top layer. The top image may now be used as a portable conformable mask for imaging the bottom layer. The actinic wavelength for the bottom layer photoresist is 300–400nm. The wafers are flood exposed using an Optical Applied Inc. deep UV model 29D with a 310nm narrow band filter. The dosage is 300mJ/cm$^2$ as determined by an OAI radiometer for wavelengths centered at 310nm. The wafers are then developed in AZ 312 MIF developer 2:1 dilution in an immersion mode for 180 seconds with slight agitation. The wafers are immediately rinsed with DI water and spin dried. The wafers are again examined using a scanning electron microscope at 10,000 magnification. A 2μm single space and larger geometries are clearly seen to be completely opened.

EXAMPLE 4

The top layer photoresist, disclosed in U.S. Pat. No. 4,588,670, has the following formulation:

|  | w/w % |
|---|---|
| Cresol novolac resin | 14.7 |
| 4,4'-bis pyridyl ethylene dye | 2.0 |
| 2,3,4-trihydroxyphenyl heptyl ketone-1,2-naphthoquinone-2-diazide-5-sulfonic acid trisester | 3.7 |
| Propylene glycol monomethyl ether acetate | 79.6 |

The bottom layer of the photoresist has the following formulation:

|  | w/w % |
|---|---|
| Cresol Novolac Resin | 23.0 |
| 2,3,4-trihydroxy benzophenone 1,2 naphthoquinone-2-diazide-4-sulfonic acid trisester | 3.0 |
| Cymel 325 resin | 1.8 |
| Propylene glycol monomethyl ether acetate | 72.2 |

Using the bottom layer photoresist, silicon wafers are coated at 2000 rpm and then soft-baked in a vented convection oven at 90° C. for 30 minutes. The coated wafers are baked again in a vented convection oven at 100° C. for 10 minutes. After the wafers cool to room temperature, the top layer photoresist is coated on the bottom layer photoresist at 2000 rpm and then soft-baked in a vented convection oven at 90° C. for 30 minutes.

Actinic exposure is applied using the Perkin Elmer 220 Micralign aligner through a glass photomask containing a resolution test pattern. The dosage is 175mJ/cm$^2$ as determined by an OAI radiometer for wavelengths between 365 and 436nm.

After developing the exposed wafers in AZ 400K Developer 1:3 dilution in an immersion mode for 70 seconds with slight agitation, the wafers are rinsed with deionized water and spin dried. The wafers are now examined using a scanning electron microscope at 10,000 magnification. A 2 μm single space and larger geometries are clearly seen to be completely open through the top layer. The top image may now be used as a portable conformable mask for imaging the bottom layer. The actinic wavelength for the bottom layer photoresist is 300–400nm. The wafers are flood exposed using an Optical Applied Inc. deep UV model 29D with a 310nm narrow band filter. The dosage is 150mJ/cm$^2$ as determined by an OAI radiometer for wavelengths centered at 310nm. The wafers are then developed in AZ 312 MIF Developer 2:1 dilution in an immersion mode for 60 seconds with slight agitation. The wafers are immediately rinsed with DI water and spin dried. The wafers are again examined using a scanning electron microscope at 10,000 magnification. A 2 μm single space and larger geometries are clearly seen to be completely opened.

EXAMPLE 5

The top layer photoresist, disclosed in U.S. Pat. No. 4,588,670, has the following formulation:

|  | w/w % |
|---|---|
| Cresol novolac resin | 14.7 |
| 4,4'-bis pyridyl ethylene dye | 2.0 |
| 2,3,4-trihydroxyphenyl heptyl ketone-1,2-naphthoquinone-2-diazide-5-sulfonic acid trisester | 3.7 |

|                                           | w/w % |
|-------------------------------------------|-------|
| Propylene glycol monomethyl ether acetate | 79.6  |

The bottom layer of the photoresist has the following formulation:

|                                                                                          | w/w % |
|------------------------------------------------------------------------------------------|-------|
| Cresol Novolac Resin                                                                     | 23.0  |
| 2,3,4-trihydroxyphenyl octyl ketone 1,2-naphtho-quinone-2-diazide-4-sulfonic acid trisester | 3.0   |
| Cymel 325 resin                                                                          | 1.8   |
| Propylene glycol monomethyl ether acetate                                                | 72.2  |

Using the bottom layer photoresist, silicon wafers are coated at 2000 rpm and then soft-baked in a vented convection oven at 90° C. for 30 minutes. A broad band flood exposure is applied using a Oriel model 8089 exposure unit. The dosage is 5mJ/cm$^2$ as determined by an OAI radiometer for wavelengths between 365 and 436nm. The coated wafers are post exposure baked in a vented convection oven at 100° C. for 10 minutes. After the wafers cool to room temperature, the top layer photoresist is coated on the bottom layer photoresist at 2000 rpm and then soft-baked in a vented convection oven at 90° C. for 30 minutes.

Actinic exposure is applied using the Perkin Elmer 220 Micralign aligner through a glass photomask containing a resolution test pattern. The dosage is 175mJ/cm$^2$ as determined by an OAI radiometer for wavelengths between 365 and 436nm.

After developing the exposed wafers in AZ 400K Developer 1:3 dilution in an immersion mode for 70 seconds with slight agitation, the wafers are rinsed with deionized water and spin dried. The wafers are now examined using a scanning electron microscope at 10,000 magnification. A 2 μm single space and larger geometries are clearly seen to be completely open through the top layer. The top image may now be used as a portable conformable mask for imaging the bottom layer. The actinic wavelength for the bottom layer photoresist is 300–400nm. The wafers are flood exposed using an Optical Applied Inc. deep UV model 29D with a 310nm narrow band filter. The dosage is 200mJ/cm$^2$ as determined by an OAI radiometer for wavelengths centered at 310nm. The wafers are then developed in AZ 312 MIF Developer 2:1 dilution in an immersion mode for 5 minutes with slight agitation. The wafers are immediately rinsed with DI water and spin dried. The wafers are again examined using a scanning electron microscope at 10,000 magnification. A 2 μm single space and larger geometries are clearly seen to be completely opened.

EXAMPLE 6

The top layer photoresist, disclosed in U.S. Pat. No. 4,588,670, has the following formulation:

|                                                                                            | w/w % |
|--------------------------------------------------------------------------------------------|-------|
| Cresol novolac resin                                                                       | 14.7  |
| 4,4'-bis pyridyl ethylene dye                                                              | 2.0   |
| 2,3,4-trihydroxyphenyl heptyl ketone-1,2-naphthoquinone-2-diazide-5-sulfonic acid trisester | 3.7   |
| Propylene glycol monomethyl ether acetate                                                  | 79.6  |

The bottom layer of the photoresist has the following formulation:

|                                                                                             | w/w % |
|---------------------------------------------------------------------------------------------|-------|
| Cresol Novolac Resin                                                                        | 23.0  |
| 2,3,4-trihydroxyphenyl nonyl ketone 1,2-naphtho-quinone-2-diazide-4-sulfonic acid trisester | 3.0   |
| Cymel 325 resin                                                                             | 1.8   |
| Propylene glycol monomethyl ether acetate                                                   | 72.2  |

Using the bottom layer photoresist, silicon wafers are coated at 2000 rpm and then soft-baked in a vented convection oven at 90° C. for 30 minutes. A broad band flood exposure is applied using a Oriel model 8089 exposure unit. The dosage is 5mJ/cm$^2$ as determined by an OAI radiometer for wavelengths between 365 and 436nm. The coated wafers are post exposure baked in a vented convection oven at 100° C. for 10 minutes. After the wafers cool to room temperature, the top layer photoresist is coated on the bottom layer photoresist at 2000 rpm and then soft-baked in a vented convection oven at 90° C. for 30 minutes.

Actinic exposure is applied using the Perkin Elmer 220 Micralign aligner through a glass photomask containing a resolution test pattern. The dosage is 175mJ/cm$^2$ as determined by an OAI radiometer for wavelengths between 365 and 436nm.

After developing the exposed wafers in AZ 400K Developer 1:3 dilution in an immersion mode for 70 seconds with slight agitation, the wafers are rinsed with deionized water and spin dried. The wafers are now examined using a scanning electron microscope at 10,000 magnification. A 2 μm single space and larger geometries are clearly seen to be completely open through the top layer. The top image may now be used as a portable conformable mask for imaging the bottom layer. The actinic wavelength for the bottom layer photoresist is 300–400nm. The wafers are flood exposed using an Optical Applied Inc. deep UV model 29D with a 310nm narrow band filter. The dosage is 270mJ/cm$^2$ as determined by an OAI radiometer for wavelengths centered at 310nm. The wafers are then developed in AZ 312 MIF Developer 2:1 dilution in an immersion mode for 60 seconds with slight agitation. The wafers are immediately rinsed with DI water and spin dried. The wafers are again examined using a scanning electron microscope at 10,000 magnification. A 2 μm single space and larger geometries ar clearly seen to be completely opened.

EXAMPLE 7

The top layer photoresist has the following formulation:

|                                                                                                                                  | w/w % |
|----------------------------------------------------------------------------------------------------------------------------------|-------|
| Cresol Novolac Resin                                                                                                             | 15.7  |
| Photosensitizer comprising the condensation product of 2,3,4-trihydroxybenzophenone and 1,2-naphthoquinone-2-diazide-5-sulfonyl chloride | 5.2   |
| AZ Thinner                                                                                                                       | 76.7  |
| Bispyridyl ethylene dye                                                                                                          | 2.4   |

The bottom layer photoresist has the following formulation:

| | w/w % |
|---|---|
| Cresol novolac resin | 23.1 |
| Propylene glycol monomethyl ether acetate | 72.0 |
| Condensation product of 2,3,4-trihydroxy-benzophenone with a 90/10 mixture 1,2-naphthoquinone-2-diazide-4-sulfonyl chloride and 1,2-naphthoquinone-2-diazide-5-sulfonyl chloride | 3.0 |
| Dimethylol p-cresol | 1.0 |
| Macrolex yellow dye (Mobay Chemical Co.) | 0.9 |

Using the bottom layer photoresist, silicon wafers are coated at 2000 rpm and then soft-baked in a vented convection oven at 90° C. for 30 minutes. A broad band floor exposure is applied using a Oriel model 8089 exposure unit. The dosage is 30mJ/cm2 as determined by an OAI radiometer for wavelengths between 365 and 436nm. The coated wafers are post exposure baked in a vented convection oven at 120° C. for 15 minutes. After the wafers cool to room temperature, the top layer photoresist is coated on the bottom layer photoresist at 2000 rpm and then soft-baked in a vented convection oven at 90° C. for 30 minutes.

Actinic exposure is applied using the TRE G-Line Stepper through a glass photomask containing a resolution test pattern. The dosage is 300mJ/cm2.

After developing the exposed wafers in AZ 400K Developer 1:3 dilution in an immersion mode for 90 seconds with slight agitation, the wafers are rinsed with deionized water and spin dried. The wafers are now examined using a scanning electron microscope at 10,000 magnification. A 2 μm single space and larger geometries are clearly seen to be completely open through the top layer. The top image may now be used as a portable conformable mask for imaging the bottom layer. The actinic wavelength for the bottom layer photoresist is 300–400nm. The wafers are flood exposed using an Optical Applied Inc. deep UV model 29D with a 310nm narrow band filter. The dosage is 120mJ/cm2 as determined by an OAI radiometer for wavelengths centered at 310nm. The wafers are then developed in AZ 312 MIF developer diluted with water in a 5:1 ratio in an immersion mode for 180 seconds with slight agitation. The wafers are immediately rinsed with DI water and spin dried. The wafers are again examined using a scanning electron microscope at 10,000 magnification. A 2 μm single space and larger geometries are clearly seen to be completely opened.

What is claimed is:

1. A process for preparing a positive photoresist image using a portable conformable mask which consists essentially of in order:
   (a) forming a first photosensitive composition which consists essentially of
     (i) from about 1% to about 25% based on the weight of the solid parts of the composition of a photosensitive compound having the formula

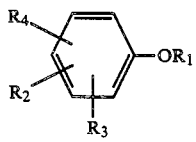

wherein $R^1$ = 1, 2-benzoquinone-2-diazide-4-sulfonyl; 1,2-naphthoquinone-2-diazide-4-sulfonyl; or 1,2-anthraquinone-2-diazide-4-sulfonyl $R_2$ = R, $R_7$, $OR_6$ or

$R_3$ = H, $R_7$, $OR_6$ or

$R_4$ = H, $R_7$, $OR_6$ or

$R_6$ = H, alkyl, aryl, aralkyl or $R_1$
$R_7$ = alkyl, aryl or aralkyl (ii) from about 75% to about 99% based on the weight of the solid parts of the composition of a novolak, and/or polyvinyl phenol resin; and
(iii) from about 0.5% to about 20% based on the weight of the solid parts of said composition of a crosslinking compound which, when in the presence of that amount and strength of the acid generated when said diazide is exposed to actinic radiation, is capable of crosslinking said resin under the application of the heating conditions of step (d); and
(iv) sufficient solvent to dissolve the foregoing composition components; and
(b) coating said first composition on a suitable substrate; and
(c) heat treating said coated substrate at a temperature of from about 20° C. to about 100° C. until enough of said solvent is dried off to render it non-tacky; and
(d) non-imagewise exposing said composition overall to sufficient actinic ultraviolet radiation and sufficient heat to partially cross-link said composition while substantially retaining its photosensitivity; and
(e) coating said first photosensitive composition directly with a second photosensitive composition comprising an o-quinone diazied, a dye which absorbs at the exposure wavelength of step (g) such that transmission through the second photosensitive composition at step (g) is about 1% or less, and a novolak and/or polyvinyl phenol resin, wherein said first photosensitive composition and said second photosensitive composition are reactive to ultraviolet radiation at substantially different wavelengths; and,
(f) imagewise exposing said second photosensitive composition to actinic ultraviolet radiation and developing with an aqueous alkaline solution to form an image mask; and
(g) exposing said first photosensitive composition to actinic ultraviolet radiation at a wavelength different from step (f) through said image mask and developing with an aqueous alkaline solution to remove the exposed portion of said first photosensitive composition.

2. The process of claim 1 wherein the photosensitizer in said first photosensitive composition is 2, 3, 4-trihydroxybenzophenone-1, 2-naphthoquinone-2-diazide-4-sulfonic acid triester.

3. The process of claim 1 wherein said crosslinker is dimethylol paracresol.

4. The process of claim 1 wherein said crosslinker is methyl methoxy diphenyl ether.

5. The process of claim 1 wherein said crosslinker is an melamine formaldehyde compound or any of its alkylated analogues.

6. The process of claim 1 wherein said crosslinker is a resole resin or an epoxy cresol novolak resin.

7. The process of claim 1 wherein said solvent in said first photosensitive composition comprises propylene glycol alkyl ether acetate.

8. The process of claim 1 wherein said substrate is selected from the group consisting of silicon, aluminum or polymeric resins, silicon dioxide, doped silicon dioxide, silicon nitride, tantalum, copper, polysilicon, ceramics and aluminum/copper mixtures.

9. The process of claim 1 wherein each of said first and said second photosensitive compositions further comprises one or more compounds selected from the group consisting of colorants, dyes, anti-striation agents, solvents, leveling agents, plasticizers, adhesion promoters, speed enhancers, and surfactants.

10. The process of claim 1 wherein said developer is an aqueous alkaline solution.

11. The process of claim 10 wherein said developer comprises sodium hydroxide and/or tetramethylammonium hydroxide.

12. The process of claim 1 wherein said resin is a novolak, said crosslinker comprises dimethylol paracresol, said exposure of step (d) is from about 5mJ/cm² to about 40mJ/cm² and said heat treatment of step (d) is conducted at a temperature of from about 90° C. to about 160° C., and said developer comprises an aqueous solution of sodium hydroxide and/or tetramethyl ammonium hydroxide.

13. The process of claim 2 wherein said resin is a novolak, said crosslinker comprises dimethylol paracresol, said exposure of step (d) is from about 5mJ/cm² to about 40mJ/cm² and said heat treatment of step (d) is conducted at a temperature of from about 90° C. to about 160° C., and said developer comprises an aqueous solution of sodium hydroxide and/or tetramethyl ammonium hydroxide.

14. A process of claim 1 wherein said composition in step (d) is not exposed to actinic radiation.

15. A process for preparing a positive working-photographic element which comprises in order:
(a) forming a first photosensitive composition which comprises
(i) from about 1% to about 25% based on the weight of the solid parts of the composition of a photosensitive compound represented by the general formulae (1), (2) or (3):

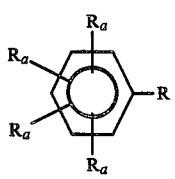
(1)

wherein R is H, —X—$R_b$ or

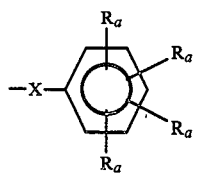

X is a single C—C bond, —O—, —S—, —SO$_2$—,

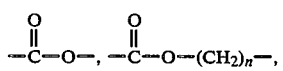

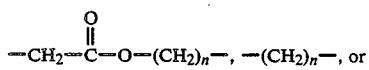

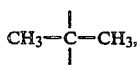

n is 1 or 2, $R_a$ is H, —OH, —OY, —OZ, halogen or lower alkyl, with at least one $R_a$ radical being —OY and at least one thereof being —OZ, $R_b$ is H, alkyl, aryl, substituted alkyl, or substituted aryl;

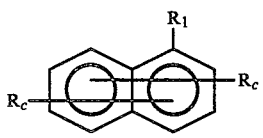
(2)

wherein $R_1$ is H, or

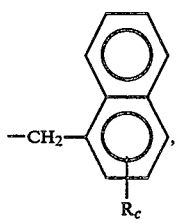

$R_c$ is H, —OH, —OY or —OZ, with at least one $R_c$ radical being —OY and at least one thereof being —OZ; and

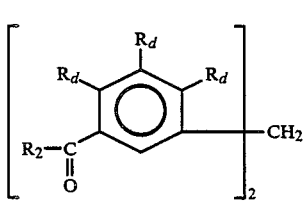
(3)

wherein $R_2$ is H, alkyl, aryl, substituted alkyl, or substituted aryl, $R_d$ is —OH, —OY or —OZ with at least one $R_d$ radical being —OY and at least one thereof being —OZ;

wherein Y is 1, 2-naphthoquinonediazide-4-sulfonyl and Z is 1,2-naphthoquinone-diazide-5-sulfonyl or an organic acid halide represented by the formula 'W—R₃, where W is

or —SO₂—, and R₃ is alkyl, aryl, substituted alkyl or substituted aryl wherein the amount of diazo and/or organic acid reacted with said phenolic compound being sufficient to produce a photosensitizer composition capable of inhibiting the dissolution rate of an alkali soluable resin in alkaline developing solution;
  (ii) from about 75% to about 99% based on the weight of the solid parts of the composition of a novolak, and/or polyvinyl phenol resin; and
  (iii) from about 0.5% to about 20% based on the weight of the solid parts of said composition of a crosslinking compound which, when in the presence of that amount and strength of the acid generated when said diazide is exposed actinic radiation, is capable of crosslinking said resin under the application of the heating conditions of step (d); and
  (iv) sufficient solvent to dissolve the foregoing composition components; and
(b) coating said first composition on a suitable substrate; and
(c) heat treating said coated substrate at a temperate of from about 20° C. to about 100° C. until enough of said solvent is dried off to render it non-tacky; and
(d) non-imagewise exposing said composition overall to sufficient actinic ultraviolet radiation and sufficient heat to partially cross-link said composition while substantially retaining its photosensitivity; and
(e) coating said first photosensitive composition directly with a second photosensitive composition comprising an o-quinone diazide, a dye which absorbs at the exposure wavelength of step (g) such that transmission through the second photosensitive composition at step (g) is about 1% or less, and a novolak and/or polyvinyl phenol resin, wherein said first photosensitive composition and said second photosensitive composition are reactive to ultraviolet radiation at substantially different wavelengths; and,
(f) imagewise exposing said second photosensitive composition to actinic ultraviolet radiation and developing with an aqueous alkaline solution to form an image mask; and
(g) exposing said first photosensitive composition to actinic ultraviolet radiation at a wavelength different from step (f) through said image mask and developing with an aqueous alkaline solution to remove the exposed portion of said first photosensitive composition.

16. A process for preparing a positive photoresist image using a portable conformable mask which consists essentially of in order:
(a) forming a first photosensitive composition which consists essentially of
  (i) from about 1% to about 25% based on the weight of the solid parts of the composition of a component comprising the condensation product of:

(I) a phenolic compound selected from the group consisting of:

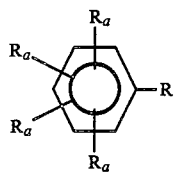

(A)

wherein R is H, —X—R_b, or

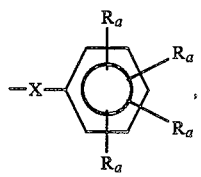

$R_a$ is H, —OH, halogen or lower alkyl, with at least two and not greater than six $R_a$ radicals being —OH, X is a single C—C bond, —O—, —S—, —SO₂',

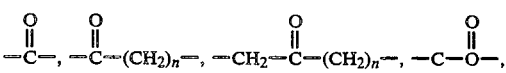

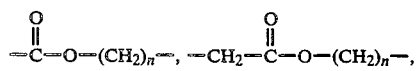

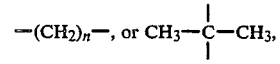

n is 1 or 2, $R_b$ is H, alkyl, aryl, substituted alkyl or substituted aryl;

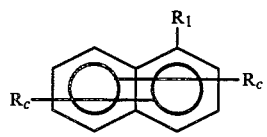

(B)

wherein R₁ is H or

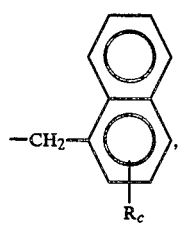

$R_c$ is H or —OH with at least two Rc radicals being —OH; and

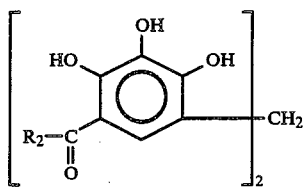

(C)

wherein $R_2$ is H, alkyl, aryl, substituted alkyl, or substituted aryl;

(II) a 1, 2-naphthoquinonediazide-4-sulfonic acid (diazo 1); and (III) a 1,2-naphthoquinonediazide-5-sulfonic acid (Diazo 2) and/or an organic acid halide represented by the formula:

$$W-R_3$$

wherein W is

or $-SO_2-V$, V is halogen, $R_3$ is alkyl, aryl, substituted alkyl or substituted aryl and the amount of diazo and/or organic acid reacted with said phenolic compound being sufficient to produce a photosensitizer composition capable of inhibiting the dissolution rate of an alkali soluble resin in alkaline developing solution;

wherein the molar ratio of the amount of Diazo 1 reacted to the amount of Diazo 2 and/or organic acid reacted is in the range of from about 1:1 to about 39:1;

(ii) from about 75% to about 99% based on the weight of the solid parts of the composition of a novolak, and/or polyvinyl phenol resin; and (iii) from about 0.5% to about 20% based on the weight of the solid parts of said composition of a crosslinking compound which, when in the presence of that amount and strength of the acid generated when said diazide is exposed to actinic radiation, is capable of crosslinking said resin under the application of the heating conditions of step (d); and (iv) sufficient solvent to dissolve the foregoing composition components; and (b) coating said first composition on a suitable substrate; and (c) heat treating said coated substrate at a temperature of from about 20° C. to about 100° C. until enough of said solvent is dried off to render it non-tacky; and (d) non-imagewise exposing said composition overall to sufficient actinic ultraviolet radiation and sufficient heat to partially cross-link said composition while substantially retaining its photosensitivity; and (e) coating said first photosensitive composition directly with a second photosenstive composition comprising an o-quinone diazide, a dye which absorbs at the exposure wavelength of step (g) such that transmission through the second photosensitive composition at step (g) is about 1% or less, and a novolak and/or polyvinyl phenol resin, wherein said first photosensitive composition and said second photosenstive composition are reactive to ultraviolet radiation at substantially different wavelengths; and, (f) imagewise exposing said second photosensitive composition to actinic ultraviolet radiation and developing with an aqueous alkaline solution to form an image mask; and (g) exposing said first photosensitive composition to actinic ultraviolet radiation at a wavelength different from step (f) through said image mask and developing with an aqueous alkaline solution to remove the exposed portion of said first photosensitive composition.

* * * * *